United States Patent
Ohashi

(10) Patent No.: US 8,286,340 B2
(45) Date of Patent: Oct. 16, 2012

(54) METHOD OF MANUFACTURING AND WARPAGE CORRECTING OF PRINTED CIRCUIT BOARD ASSEMBLY

(75) Inventor: Yukihiko Ohashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1034 days.

(21) Appl. No.: 11/841,393

(22) Filed: Aug. 20, 2007

(65) Prior Publication Data

US 2008/0123307 A1    May 29, 2008

(30) Foreign Application Priority Data

Nov. 29, 2006    (JP) .................................. 2006-322459

(51) Int. Cl.
*H05K 3/20* (2006.01)
(52) U.S. Cl. ........................................................ 29/831
(58) Field of Classification Search .................. 174/260, 174/263; 228/102, 212, 180.21; 257/737, 257/778, 783; 361/760, 767, 771, 783; 29/740, 29/760, 830–832, 840
See application file for complete search history.

(56) References Cited

U.S. PATENT DOCUMENTS

| | | | | |
|---|---|---|---|---|
| 5,862,588 A | * | 1/1999 | Heim et al. | 29/840 |
| 6,138,893 A | * | 10/2000 | Caletka et al. | 228/102 |
| 6,201,707 B1 | * | 3/2001 | Sota | 361/760 |
| 7,352,071 B2 | | 4/2008 | Yee | |
| 2006/0231941 A1 | | 10/2006 | Huang et al. | |

FOREIGN PATENT DOCUMENTS

| | | |
|---|---|---|
| JP | 3-163896 A | 7/1991 |
| JP | 11-46060 A | 2/1999 |
| JP | 11-260499 A | 9/1999 |
| JP | 2000-059018 A | 2/2000 |
| JP | 2000-353863 A | 12/2000 |
| JP | 2002-57451 A | 2/2002 |
| JP | 2005-175117 A | 6/2005 |
| TW | 489496 | 6/2002 |
| TW | 231578 | 4/2005 |

OTHER PUBLICATIONS

Korean Office Action dated Apr. 22, 2009 (mailing date), issued in corresponding Korean Patent Application No. 10-2007-0092086.
Chinese Office Action dated Jul. 24, 2009, issued in corresponding Chinese Patent Application No. 200710152181.
Japanese Office Action dated Feb. 25, 2011, issued in corresponding Japanese Patent Application No. 2006-322459. (w/partial English translation).
Taiwanese Office Action dated Aug. 17, 2007, issued in corresponding Tawianese Patent Application No. 096130475.
Taiwanese Office Action dated Apr. 21, 2011, issued in corresponding Taiwanese Patent Application No. 096130475.

* cited by examiner

*Primary Examiner* — Derris Banks
*Assistant Examiner* — Jeffrey T Carley
(74) *Attorney, Agent, or Firm* — Westerman, Hattori, Daniels & Adrian, LLP

(57) ABSTRACT

A printed circuit board for mounting an electronic part includes a mounting surface configured so that the electronic part is mounted. A warpage correcting metal pattern is provided on a back surface of the printed circuit board opposite to the mounting surface. The warpage correcting metal pattern may be formed of a metal film or a metal layer joinable with a thermally meltable joining material.

14 Claims, 9 Drawing Sheets

METHOD OF MANUFACTURING AND WARPAGE CORRECTING OF PRINTED CIRCUIT BOARD ASSEMBLY

BACKGROUND OF THE INVENTION

1. Field of the Invention

The present invention generally relates to printed circuit boards and, more particularly, to a printed circuit board having a structure to correct warpage, a printed circuit board assembly in which electronic parts are mounted on such a printed circuit board, a manufacturing method of a printed circuit board for manufacturing a printed circuit board while correcting warpage, a manufacturing method of a printed circuit board assembly for manufacturing a printed circuit board assembly by mounting electronic parts while correcting warpage, and a correcting method for correcting warpage of a printed circuit board.

2. Description of the Related Art

When mounting electronic parts to a printed circuit board, the electronic parts may not be mounted well if there is a deformation such as warpage in the printed circuit board. When warpage of a printed circuit board causes a problem, it is necessary to mount electronic parts to the printed circuit board while acquiring flatness by correcting the warpage.

There are suggested the following method to correct warpage of a printed circuit board in a mounting process.

1) Electronic parts are mounted after flatten a printed circuit board by mounting the printed circuit board on a flat placement surface of a conveyance carrier, arranging a warpage correction press block on a side of a part mount head, and pressing the printed circuit board onto the flat placement surface of the conveyance carrier by the press block immediately before mounting the electronic parts.

2) Electronic parts are mounted to a printed circuit board by arranging many warpage correction pins in a part mounting mechanism part and while correcting warpage of the printed circuit board by pressing the warpage correction pins onto the printed circuit board.

3) Printed circuit board is placed on a flat placement surface of a conveyance carrier and fastened by screws.

In the above-mentioned methods, it is required to acquire a part for pressing pins onto a part of a printed circuit board or a part for fasting screws, thereby reducing an effective area of a printed circuit board.

Moreover, a surface of a printed circuit board may get scratches due to a contact of the pressing pins, which generates dusts. Also in the case of screw fastening, screws and a conveyance carrier are in friction with each other, which may generate dusts. Those dusts contaminate printed circuit boards and electronic parts. If the dusts are electrically conductive substances, there is a problem in that they short-circuit electronic parts and between terminals of the printed circuit boards. Or, there is a problem in that the ducts enter a joining part between an electronic part and a printed circuit board, which deteriorates bonding reliability.

Furthermore, in the methods of 1) and 2), although warpage of the printed circuit board is in a corrected state when mounting electronic parts, the printed circuit board tends to return to an original warped state immediately after the pressing block or the correction pins are separated from the printed circuit board. Accordingly, for example, since cure of a bonding material to join electronic parts is not progressed sufficiently, a force to return the printed circuit board to an initial warped state is exerted, and, thus, there may be a problem in that the bonded part is separated.

In order to solve the above problems, there is suggested a method of correcting warpage of a printed circuit board by clamping a peripheral part of the printed circuit board between a conveyance carrier and a warpage preventing metal fitting (for example, refer to Patent Document 1 and Patent Document 2). Additionally, there is suggested a method of mounting electronic parts in a state where a printed circuit board is applied to a conveyance carrier by using a pressure-sensitive adhesive double coated tape (For example, refer to Patent Document 3).

Patent Document 1: Japanese Laid-Open Patent Application No. 2002-57451

Patent Document 2: Japanese Laid-Open Patent Application No. 11-46060

Patent Document 3: Japanese Laid-Open Patent Application No. 3-163896

According to the method of correcting warpage of a printed circuit board by clamping a periphery of the printed circuit board between a conveyance carrier and a warpage preventing metal fitting, a problem of material taking of a printed circuit board is solved since warpage is corrected by clamping a periphery of the printed circuit board, which is not an effective area. Additionally, since the printed circuit board can be fixed to a conveyance carrier even after mounting electronic parts, warpage of the printed circuit board can be corrected until a bonding material is cured sufficiently after mounting. However, since the printed circuit board is clamped by a warpage preventing metal fitting, the problem of generation of dusts due to contact of the warpage preventing metal fitting is not solved. Additionally, a work of clamping a periphery of a printed circuit board by a warpage preventing metal fitting is a troublesome work.

On the other hand, according to the method of mounting electronic parts in a state where a printed circuit board is applied to a conveyance carrier by using a pressure-sensitive adhesive double coated tape, there is a problem in that the double coated tape is deformed when an electronic part is pressed onto a printed circuit board and also the printed circuit board is deformed since the double coated tape is arranged between the conveyance carrier and the printed circuit board. Additionally, it is necessary to peel off the printed circuit board from the double coated tape after mounting electronic parts, and an external force, which may deform the printed circuit board when peeling off, may lower the mounting reliability.

SUMMARY OF THE INVENTION

It is a general object of the present invention to provide an improved and useful printed circuit board in which the above-mentioned problems are eliminated.

A more specific object of the present invention is to provide a printed circuit board capable of holding a printed circuit board in a state where the printed circuit board is held along a flat placement surface of a conveyance carrier without pressing the printed circuit board, a printed circuit board assembly in which electronic parts are mounted onto such a printed circuit board, and an electronic device in which such a printed circuit board assembly is incorporated.

Another object of the present invention is to provide a manufacturing method of manufacturing a printed circuit board assembly by mounting electronic parts while correcting warpage by causing a printed circuit to be along a flat placement surface of a conveyance carrier without pressing the printed circuit board.

A further object of the present invention is to provide a correcting method of correcting warpage of a printed circuit board by causing the printed circuit to be along a flat placement surface of a conveyance carrier without pressing the printed circuit board.

In order to achieve the above-mentioned objects, there is provided according to one aspect of the present invention a printed circuit board for mounting an electronic part, comprising: a mounting surface configured so that the electronic part is mounted; a back surface opposite to the mounting surface; and a warpage correcting metal pattern provided on the back surface.

In the printed circuit board according to the present invention, the warpage correcting metal pattern may be formed of a metal film or a metal layer that is joinable with a thermally meltable joining material. The warpage correcting metal pattern may be formed by metal plating. The warpage correcting metal pattern may be formed by copper plating. A plurality of said warpage correcting metal patterns may be provided on said back surface. The said warpage correcting metal patterns are provided in a part that is cut off when cutting the printed circuit board.

Additionally, there is provided according to another aspect of the present invention a printed circuit board assembly comprising: the above-mentioned printed circuit board; and an electronic part mounted on the printed circuit board.

Further, there is provided according to another aspect of the present invention an electronic device comprising the above-mentioned printed circuit board assembly.

Additionally, there is provided according to another aspect of the present invention a manufacturing method of a printed circuit board, comprising: forming a warpage correcting metal pattern on a surface of the printed circuit board; placing the printed circuit board on a placement table in which a joining part is formed at a position opposite to said warpage correcting metal pattern; and correcting warpage of the printed circuit board by joining the warpage correcting metal pattern to the joining part using a thermally meltable joining material.

In the manufacturing method of a printed circuit board according to the present invention, when joining said printed circuit board to a conveyance carrier, a back surface of said printed circuit board may be brought into close contact with a placement surface by accommodating said warpage correcting metal pattern in a concave part provided in said placement surface. The thermally meltable joining material may be supplied to at least one of said warpage correcting metal pattern and said concave part; and said warpage correction metal pattern may be joined to said conveyance carrier by solidifying said thermally meltable joining material in said concave part after melting said thermally meltable joining material. The thermally meltable joining material may be heated by heating a part near said concave part of said conveyance carrier from outside. Heating of said part near said concave part of said conveyance carrier may be performed by an electric heater being brought into contact with said part neat said concave part of said conveyance carrier, and said thermally meltable joining material in said concave part may be cooled and solidified by separating said electric heater from said conveyance carrier after heating.

In the manufacturing method of a printed circuit board according to the present invention, said warpage correcting metal pattern may be formed by copper plating, and said warpage correcting metal pattern may be joined to said conveyance carrier using a solder as said thermally meltable joining material.

Additionally, there is provided according to another aspect of the present invention a manufacturing method of a printed circuit board assembly, comprising: manufacturing a printed circuit board according to the above-mentioned manufacturing method of a printed circuit board; and mounting an electronic part to the printed circuit board that is joined to a conveyance carrier. The printed circuit board may be separated from said conveyance carrier by heating and melting said thermally meltable joining material after mounting said electronic part to said printed circuit board. A thermosetting resin may be supplied between said electronic part and said printed circuit board, and the thermosetting resin may be heated to be cured by heating said electronic part. The thermally meltable joining material may be heated and melted after said thermosetting resin is cured, and said printed circuit board is separated from said conveyance carrier.

Further, there is provided according to another aspect of the present invention a correcting method of warpage of a printed circuit board, comprising: correcting warpage of a printed circuit board by joining said printed circuit board to said conveyance carrier by a thermally meltable joining material so using a warpage correcting metal pattern formed on a hack surface opposite to a mounting surface of the printed circuit board so that said printed circuit board is closely contact with a flat placement surface of a conveyance carrier. When joining said printed circuit board to said conveyance carrier, said back surface of said printed circuit board may be brought into closely contacted with said placement surface by accommodating said warpage correcting metal pattern in a concave portion provided in said placement surface. The thermally meltable joining material may be supplied to at least one of said warpage correcting metal pattern and said concave part; and said warpage correction metal pattern may be joined to said conveyance carrier by solidifying said thermally meltable joining material in said concave part after melting said thermally meltable joining material. The thermally meltable joining material may be heated by heating a part near said concave part of said conveyance carrier from outside. Heating of said part near said concave part of said conveyance carrier may be performed by an electric heater being brought into contact with said part neat said concave part of said conveyance carrier, and said thermally meltable joining material in said concave part may be cooled and solidified by separating said electric heater from said conveyance carrier after heating. The warpage correcting metal pattern may be formed by copper plating, and said warpage correcting metal pattern may be joined to said conveyance carrier using a solder as said thermally meltable joining material.

According to the present invention, the printed circuit board can be maintained in a flat state along the placement surface of the conveyance carrier without correcting the printed circuit board since the warpage correcting metal pattern is joined to the placement surface of the conveyance carrier by providing the warpage correcting metal pattern to the back surface side of the printed circuit board opposite to the mounting surface. Accordingly, there is no reduction in the effective mounting area of the printed circuit board. Additionally, there is no generation of dusts due to contact of a press member, and, thus, there is no decrease in the mounting reliability. Further, the printed circuit board can be fixed to the conveyance carrier even after completion of mounting, thereby holding the printed circuit board in a flat state until the joining material is cured sufficiently.

Other objects features and advantages of the present invention may become apparent from the following detailed description when read in conjunction with the accompanying drawings.

DETAILED DESCRIPTION OF THE PREFERRED EMBODIMENTS

A description will now be given, with reference to the drawings, of an embodiment of the present invention.

Figure 1:
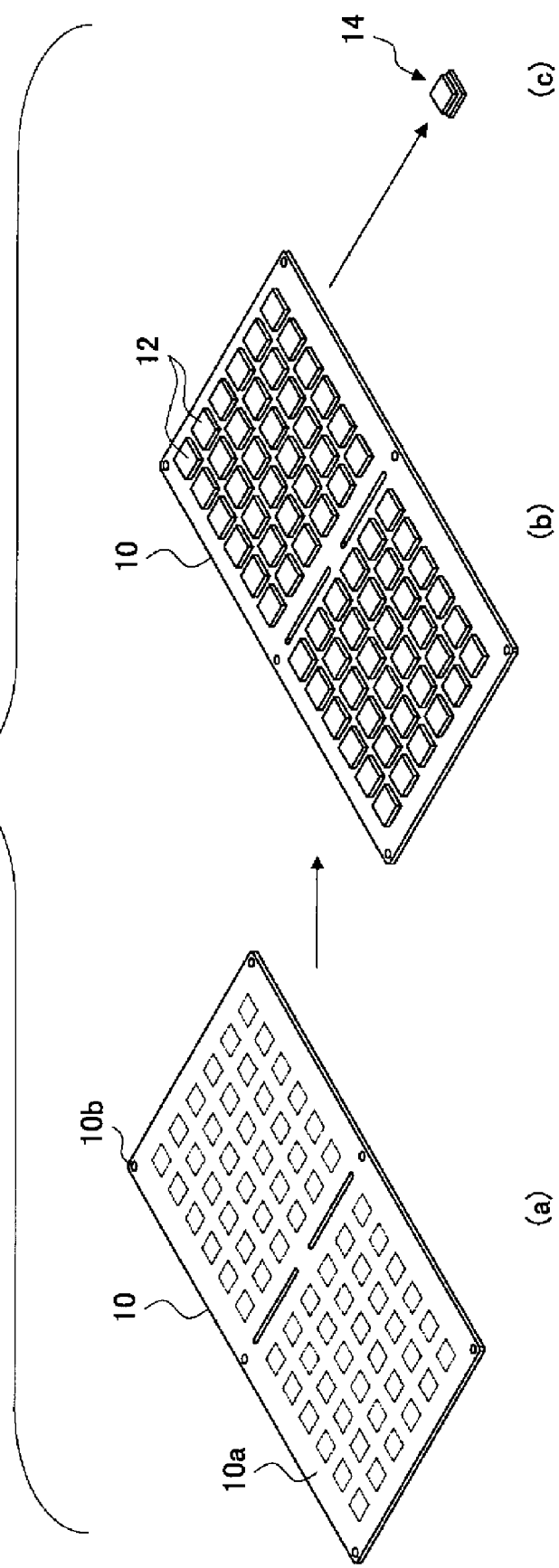
FIG. 1 is a perspective view of a printed circuit board to which the present invention is applicable.

First, a description will be given, with reference to FIG. 1, of an example of a printed circuit board to which an embodiment of the present invention is applied. FIG. 1 is a perspective view of a printed circuit board to which the present embodiment is applied. FIG. 1-(a) shows the printed circuit board before semiconductor chips as electronic parts are mounted. FIG. 1-(b) shows the printed circuit board after the semiconductor chips are mounted. FIG. 1-(c) shows a state where the semiconductor devices are individualized as electronic devices formed on the printed circuit board. Here, the semiconductor device refers to one in a state where a semiconductor chip is mounted on a printed circuit board. It should be noted that the product to which the present invention is applicable is not limited to a product which is individualized.

The printed circuit board 10 shown in FIG. 1-(a) is a glass-epoxy substrate or a polyimide substrate of a thickness of, for example, about 0.2 mm. The thickness of the printed circuit board is not limited to 0.2 mm, and various thicknesses may be used. Additionally, a material of the printed circuit board is not limited to glass-epoxy or polyamide, and various materials may be used.

A plurality of semiconductor chips 12 are mounted on a mounting surface 10a of the printed circuit board 10 in a line, as shown in FIG. 1-(b). In FIG. 1-(a), there are shown areas in which the semiconductor chips 12 are mounted, as a plurality of square areas arranged in a matrix. The printed circuit board 10 has positioning holes 10b at positions outside the mounting area. In the example of FIG. 1-(a), the positioning holes 10b are formed at a total of six positions including positions near four corners and positions of at a middle of each longer side of the printed circuit board. The positioning holes 10b are through holes used for positioning the printed circuit board 10 on a conveyance carrier.

After the semiconductor chips 12 are mounted on the printed circuit board 10, the semiconductor devices 14 as electronic devices, each of which is formed by mounting each semiconductor chip 12 to the printed circuit board 10, are individualized as shown in FIG. 1-(c) by cutting the printed circuit board 10.

Figure 2:
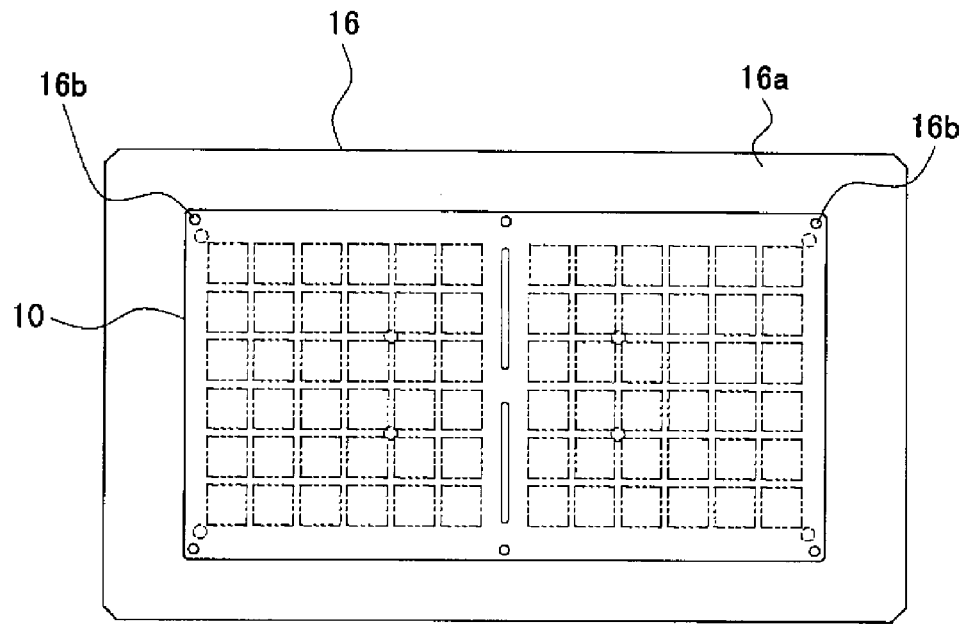
FIG. 2 is a plan view of a printed circuit board placed on a conveyance carrier.

FIG. 2 is a plan view of the printed circuit board 10 placed on the conveyance carrier 16. The printed circuit board 10 is supplied to a mounting process in a state where it is placed and held on a placement surface 16a of the conveyance carrier 16. The placement surface 16a of the conveyance carrier 16 is a flat surface so that even if the printed circuit board 10 is warped, it can be flattened by correcting the warpage by bringing the printed circuit board 10 into close contact with the placement surface 16a (contact with no gap).

Positioning pins 16b are attached to predetermined positions of the placement surface 16a of the conveyance carrier 16. The printed circuit board 10 is placed on the placement surface 16a of the conveyance carrier 16 in a state where the mounting surface 10a to which the semiconductor chips 12 are mounted faces upward and the positioning pins 16b are fitted into the positioning holes 10b. The printed circuit board 10 is positioned on a predetermined position on the mounting surface 16a of the conveyance carrier 16.

When the printed circuit board 10 is placed on the placement surface 16a of the conveyance carrier 16, if the printed circuit board 10 is warped (warpage may include deformation such as torsion), a part of the printed circuit board 10 is in a state where it is lifted from the placement surface 16a. Thereby, the printed circuit board 10 is no longer flat, which may cause a problem when the mounting the semiconductor chips 12 to the printed circuit board 10.

Thus, in order to flatten the printed circuit board 10 by bringing the printed circuit board 10 into close contact with the placement surface 16a of the conveyance carrier 16, the embodiment of the present invention is applied to the printed circuit board 10.

Figure 3:
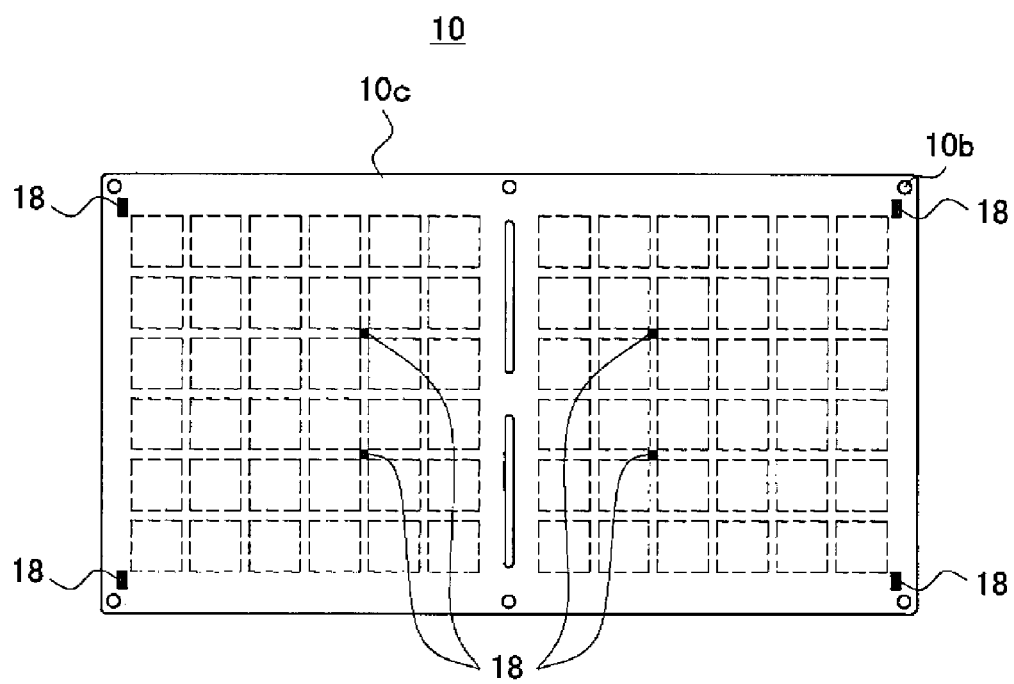
FIG. 3 is a plan view of a printed circuit board to which the present invention is applied.

A description will now be given, with reference to FIG. 3, of a structure of the printed circuit board according to an embodiment of the present invention. FIG. 3 is a plan view of the printed circuit board 10 according to the embodiment of the present invention viewed from the backside (the side facing the conveyance carrier 16).

The printed circuit board 10 according to the present embodiment has a warpage correcting metal pattern 18 on a back surface 10c thereof. The warpage correcting metal pattern 18 is a quadrilateral or rectangular pattern formed by, for example, metal plating, and provided at a plurality of positions on the back surface 10c of the printed circuit board 10. The shape of the warpage correcting metal pattern 18 is not limited to the above-mentioned. The warpage correcting metal pattern 18 is a metal layer of a metal film joinable by a thermally meltable joining material such as solder, and is joined to a predetermined part of the placement surface 16a of the conveyance carrier 16 by the thermally meltable joining material. Thereby, the printed circuit board 10 is held so as to be close contact with the flat placement surface 16a, thereby correcting warpage of the printed circuit board 10.

Figure 4:
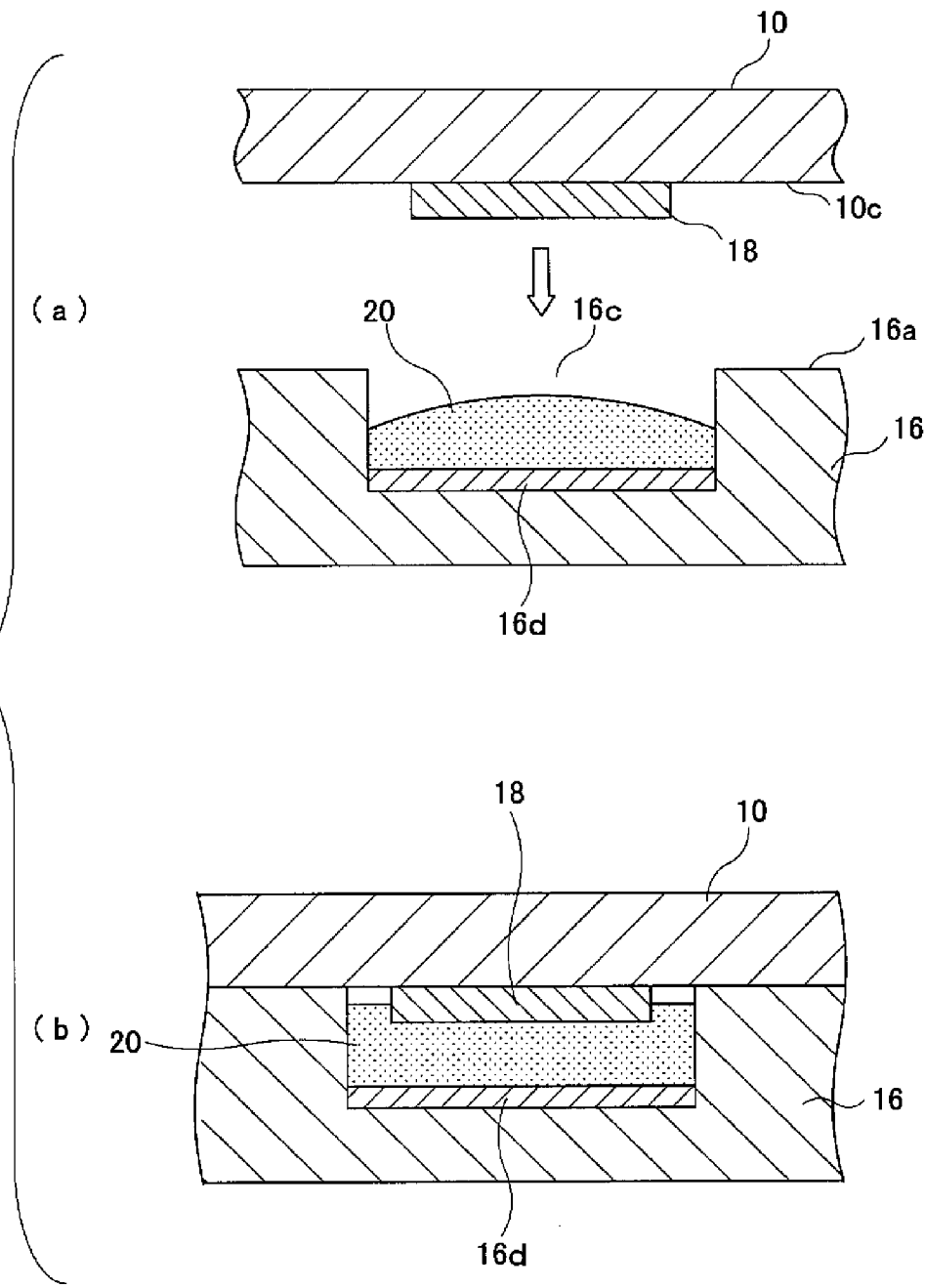
FIG. 4 is a cross-sectional view showing a joining part provided in a placement surface of a conveyance carrier so as to join a warpage correction metal pattern.

FIG. 4 is a cross-sectional view showing the printed circuit board and a joining part provided to the placement surface 16a of the conveyance carrier 16 to join the warpage correcting metal pattern 18 to the conveyance carrier 16. FIG. 4-(a) shows a state before the warpage correcting metal pattern 18 is joined to the joining part, and FIG. 4-(b) shows a state after the warpage correcting metal pattern 18 is joined to the joining part.

The warpage correcting metal pattern 18 is formed by, for example, copper plating at a predetermined position on the printed circuit board 10. Although the warpage correcting metal pattern 18 can be formed at an arbitrary position on the back surface 10c of the printed circuit board 10, it is preferable to arrange at positions near the four corners of the printed circuit board 10 and at a position near the center portion as shown in FIG. 3 so that the warpage of the printed circuit board 10 is corrected well. It should be noted that the arrangement position of the warpage correcting metal pattern 18 on the printed circuit board 10 can be determined in accordance with assumed warpage of the printed circuit board.

In the placement surface 16a of the conveyance carrier 16, a concave part 16c is provided to a part (joining part) to which the warpage correcting metal pattern is joined. Since the warpage correcting metal pattern 18 is formed to protrude from the back surface 10c of the printed circuit board 10, the back surface 10c of the printed circuit board 10 can be in close contact (contact with no gap) with the placement surface 16a of the placement surface 16 by accommodating the warpage correcting metal pattern 18 in the concave part 16c.

A metal plating layer 16d is formed on a bottom surface of the concave part 16c provided in the placement surface of the conveyance carrier 16. When solder is used as the thermally meltable joining material as mentioned later, the metal plating layer 16d is formed by copper plating, which is excellent in joining with solder. If the conveyance carrier 16 is formed of a stainless steel or aluminum, these materials are inferior in joining characteristic, but solder joining of the warpage correcting metal pattern 18 to the conveyance carrier 16 can be done by forming the metal plating layer 16d in the concave part 16c by copper plating. The material of the metal plating layer 16d is not limited to copper, and an appropriate material may be selected in accordance with a kind of the thermally meltable joining material used or a material forming the conveyance carrier. In the present embodiment, a solder 20 is used as the thermally meltable joining material, and a copper plate is used as the metal plating layer 16d. The technique to join copper by a solder is a widely used technique in mounting electronic parts to a printed circuit board, and can be realized easily.

As shown in FIG. 4-(a), the solder 20, which acts as the thermally meltable joining material, is supplied into the concave part 16c, and heated in the concave part 16c and melted. After the solder 20 is melted, the back surface 10c of the printed circuit board 10 is brought into close contact (contact with no gap) with the placement surface 16a of the conveyance carrier 16. At this time, the warpage correcting metal pattern 18 enters into the concave part 16c of the conveyance carrier 16, and contacts with the melted solder 20. Then, the solder is cooled and solidified while bringing the back surface 10c of the printed circuit board 10 into close contact (contact with not gap) with the placement surface 16a of the conveyance carrier 16. Thereby, as shown in FIG. 4-(b), the warpage correcting metal pattern 18 is joined to the metal plating layer 16d in the concave part 16c by the solder 20, and the printed circuit board 10 is held on the placement surface 16 of the conveyance carrier 16. Since the warpage correcting metal pattern 18 is arranged over the entire back surface 10c of the printed circuit board 10, the printed circuit board 10 is corrected to be flat along the flat placement surface 16a of the conveyance carrier 16 and held on the placement surface 16a as it is.

Figure 5:
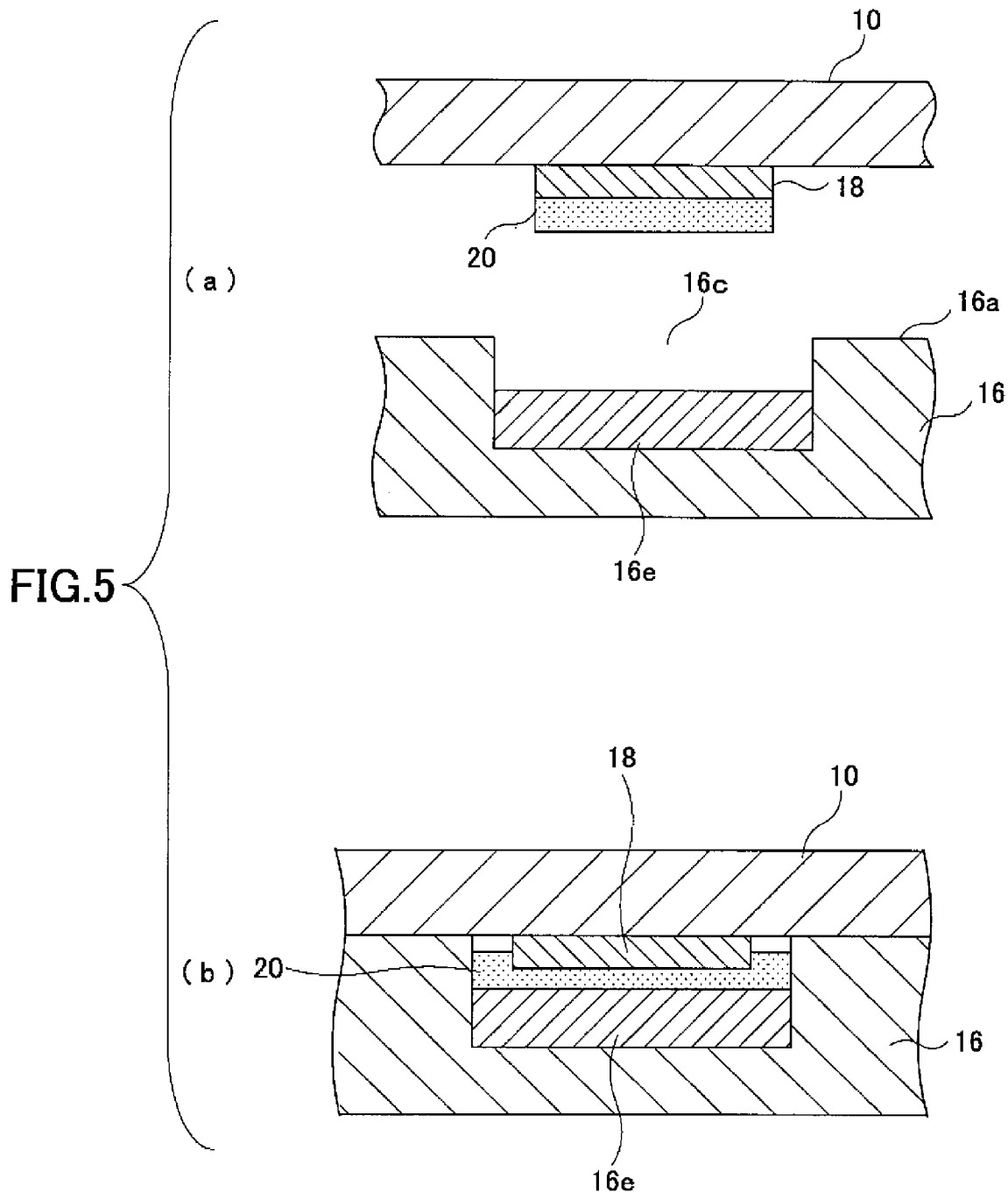
FIG. 5 is a cross-sectional view showing another example of the joining part provided in the placement surface of the conveyance carrier.

FIG. 5 is a cross-sectional view showing another example of the joining part provided in the placement surface 16a of the conveyance carrier 16. FIG. 5-(a) shows a state before the warpage correcting metal pattern 18 is joined, and FIG. 5-(b) shows a state after the warpage correcting metal pattern 18 is joined.

In the example shown in FIG. 5, similar to the example shown in FIG. 4, the concave part 16c is provided to the placement surface 16a of the conveyance carrier 16 at a position corresponding to the warpage correcting metal pattern 18. Instead of forming the metal plating layer 16d on the bottom of the concave part 16c, a joining member 16e is fitted in the concave part 16c. The joining member 16e provides the same function as the metal plating layer 16d shown in FIG. 4, and is formed of copper, which is excellent in joining with solder, in the present embodiment.

In the example shown in FIG. 5, the solder 20 is a cream solder or a solder paste, and is applied to the warpage correcting metal pattern 18 as shown in FIG. 5-(a). Then, as shown in FIG. 5-(b), the back surface 10c of the printed circuit board 10 is brought into close contact (contact with no gap) with the placement surface 16a of the conveyance carrier 16. At his time, the warpage correcting metal pattern 18 enters into the concave part 16c of the conveyance carrier 16, and contacts with the solder 20. Then, after heating and melting the solder 20, the solder 20 is cooled and solidified while the back surface 10c of the printed circuit board 10 is brought into close contact (contact with no gap) with the placement surface 16a of the conveyance carrier 16. Thereby the warpage correcting metal pattern 18 is joined to the joining member 16e in the concave part 16c by the solder 20, and the printed circuit board 10 is held on the placement surface 16a of the conveyance carrier 16.

Since the warpage correcting metal pattern 18 is a metal plating layer formed on the back surface 10c of the printed circuit board 10 in the present embodiment, if a joining force between the metal plating layer and the printed circuit board 10 is weak, it is possible that the metal plating layer is peeled off from the printed circuit board 10 due to a force of warpage of the printed circuit board 10 to return. Accordingly, it is preferable to acquire a sufficient joining area as the whole printed circuit board 10 by forming each warpage correcting metal pattern 18 in an appropriate size or increasing the number of the warpage correcting metal patterns 18 provided to the printed circuit board 10. By taking a large joining area, a degree of joining between the printed circuit board 10 and the conveyance carrier 16 can be increased. Although the warpage correcting metal pattern 18 is made into a quadrilateral or rectangle in the present embodiment, it can be an arbitrary shape such as, for example, an L-shape or a cross-shape so as to increase the joining area.

Moreover, in a case where the printed circuit board 10 is cut as shown in FIG. 1 so as to individualize the semiconductor devices, the warpage correcting metal pattern 18 is automatically removed when cutting the printed circuit board 10 by arranging the warpage correcting metal pattern 18 in a part to be cut off when cutting the printed circuit board 10 so that the warpage correcting metal pattern 18 does not remain in the semiconductor devices 14.

Figure 6:
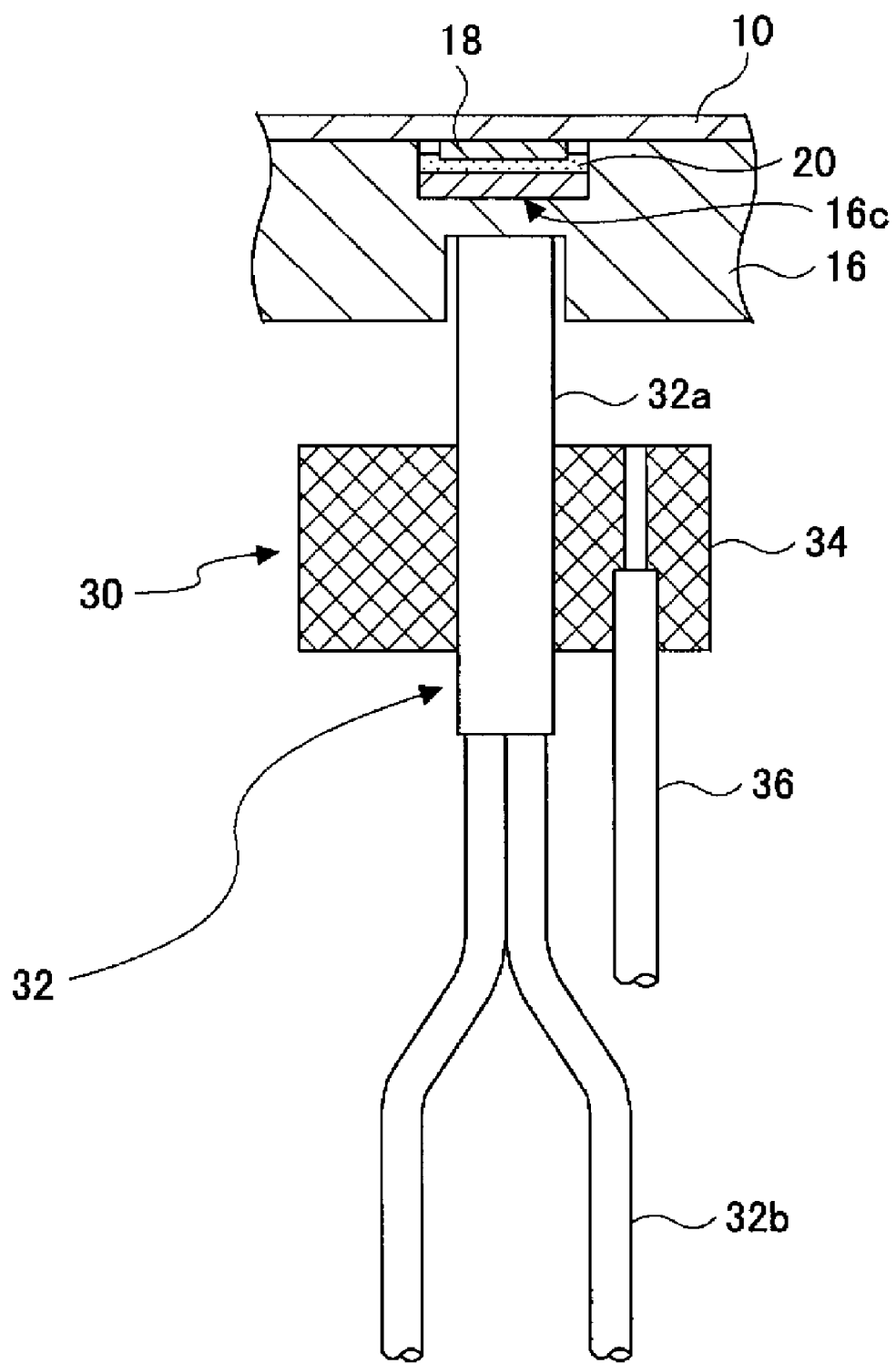
FIG. 6 is a side view of a solder heating part in a state where it is in contact with the conveyance carrier.

A description will now be given, with reference to FIG. 6, of a heating method to heat the above-mentioned solder 20. FIG. 6 is a side view of a solder heating part in a state where it is in contact with the conveyance carrier 16.

The solder heating part 30 is arranged under the conveyance carrier. The solder heating part 30 comprises a cartridge heater of a small diameter and a holder 34 holding the cartridge heater 32.

The cartridge heater 32 is a heater, for example, in which an electric heater is incorporated into a stainless steel made tube 32a and an end surface of the tube 32a is made flat. On a side opposite to the flat end surface of the tube 32a, two lead wires 32b extend to supply an electric current to the electric heater. The tube 32a is attached to the holder 34 on the side from which the lead wires 32b extend, and the cartridge heater 32 can be moved by moving the holder 34.

The flat end surface of the tube 32a is configured to contact with a part of the conveyance carrier directly under the concave part 16c. In the example of FIG. 6, a concave part is formed on a surface of the conveyance carrier 16 opposite to the surface on which the concave part 16c is formed, and the extreme end of the tube 32 is in contact with the concave part. An electric current is supplied through the lead wires 32b so as to heat the cartridge heater 32 in a state where the flat end surface of the tube 32a is brought into contact with the part of conveyance carrier 16 directly under the concave part 16c. The heat of the cartridge heater 32 is transferred to the solder 20 in the concave part 16c through the conveyance carrier 16, and the solder 20 is heated and melted. After the solder 20 is melted, the holder 34 is moved so as to separate the end surface of the conveyance carrier 16 from the conveyance carrier 16, and, thereby, the melted solder 20 is cooled and solidified.

In order to detect a temperature of the cartridge heater 32, a thermocouple 36 may be embedded in the holder 34. By previously investigating a relationship between the temperature detected by the thermocouple 36 and the temperature of the solder in the concave part 16b of the conveyance carrier, a temperature detected by the thermocouple 36 when the solder 20 is melted can be acquired. Accordingly, at a time when the temperature detected by the thermocouple 36 reaches the acquired temperature, it can be judged that the solder 20 is melted. Thus, there is no excessive heating of the conveyance carrier 16 for a long time.

It should be noted that it can be judged that the solder is melted by previously acquiring a time for melting the solder 20 by heating the conveyance carrier 16 while supplying a predetermined electric current to the cartridge heater 32 and causing the cartridge heater 32 to contact with the conveyance carrier 16 for the acquired time, instead of judging melt of the solder 20 while detecting the temperature by the thermocouple 36 as in the example of FIG. 6.

Figure 7:
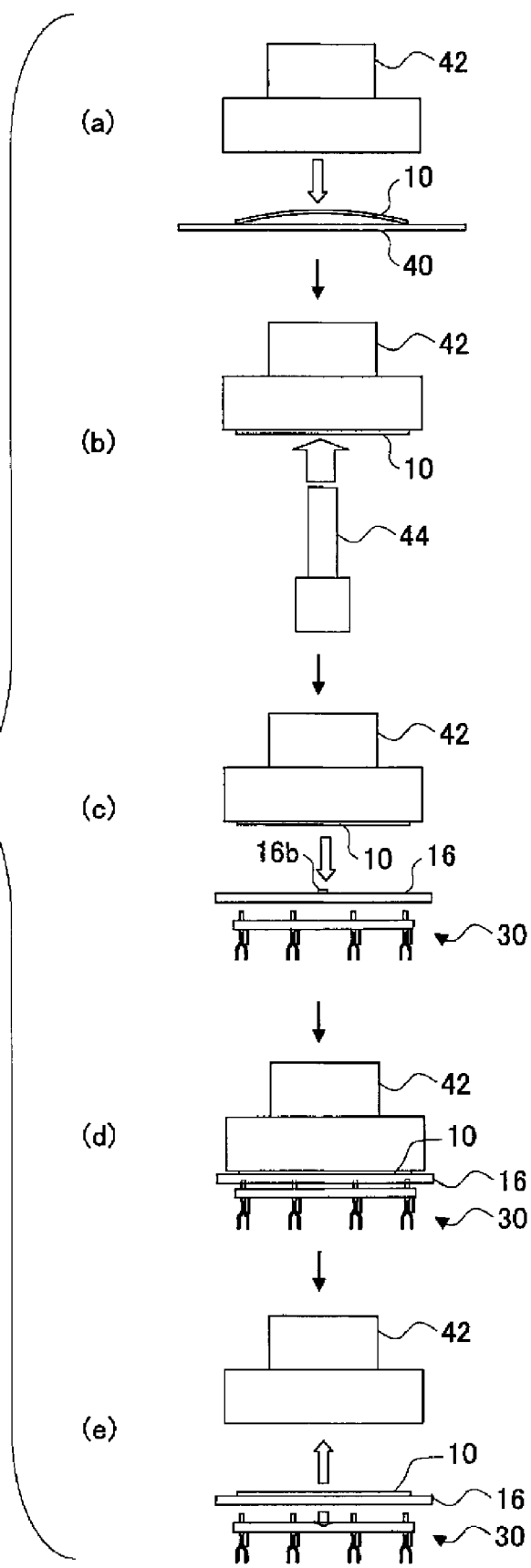
FIG. 7 is an illustration showing a part of a manufacturing process for manufacturing a printed circuit board by mounting a semiconductor chip to a printed circuit board.
Figure 8:
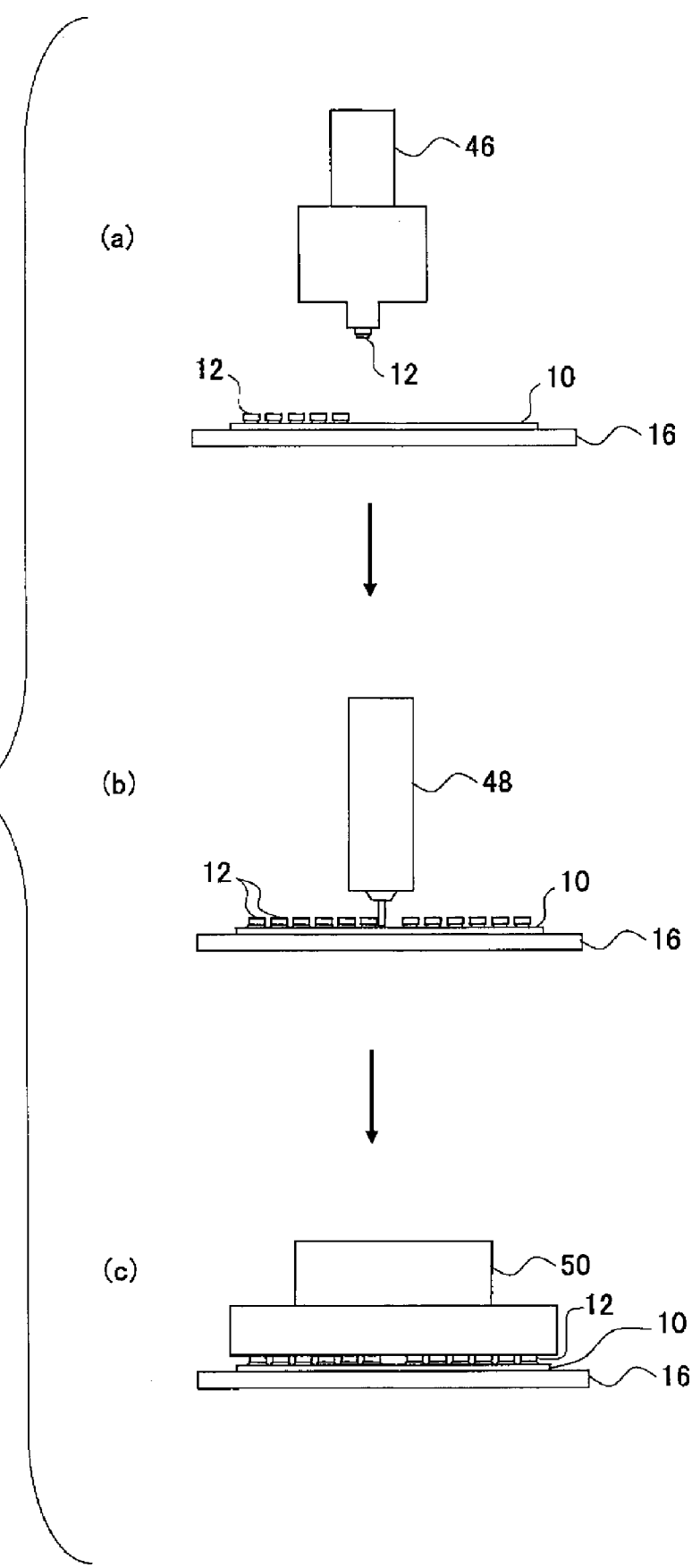
FIG. 8 is an illustration showing a part of the manufacturing process for manufacturing a printed circuit board by mounting a semiconductor chip to a printed circuit board.
Figure 9:
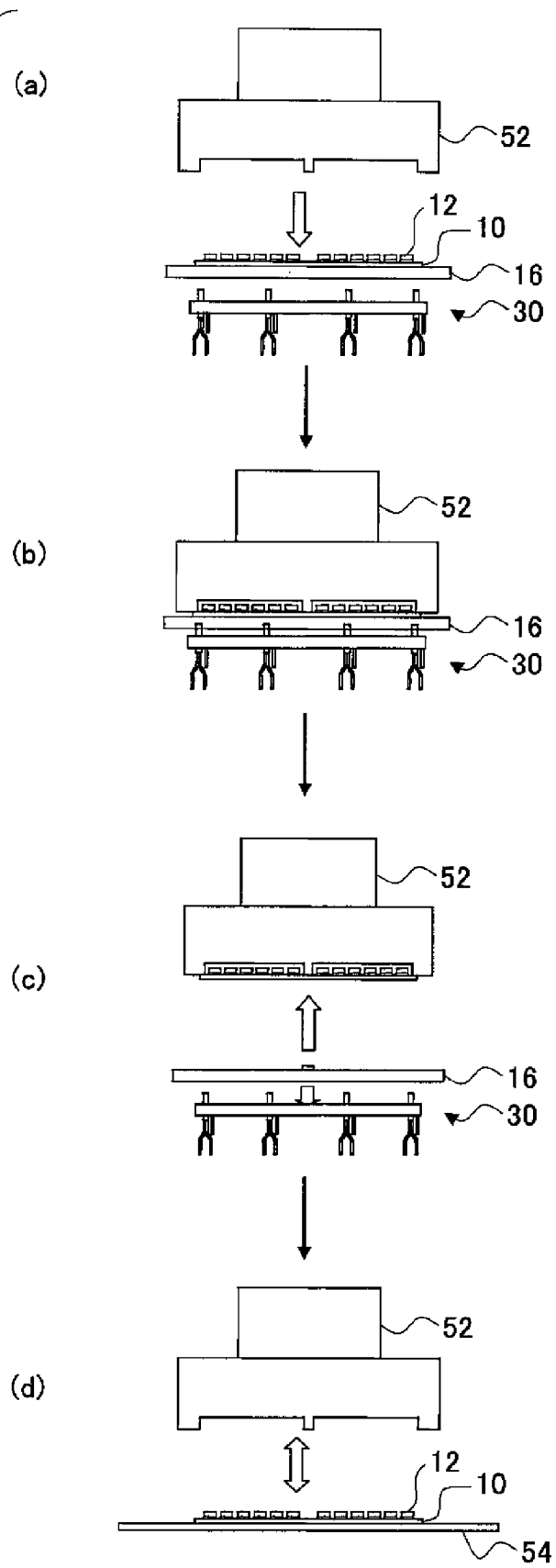
FIG. 9 is an illustration showing a part of the manufacturing process for manufacturing a printed circuit board by mounting a semiconductor chip to a printed circuit board.

A description will now be given, with reference to FIG. 7 through FIG. 9, of a method of manufacturing a printed circuit board assembly by mounting the semiconductor chips 12 as electronic parts onto the printed circuit board 10. Each of FIG. 7 through FIG. 9 is an illustration showing a part of a manufacturing process for manufacturing a printed circuit board assembly by mounting the semiconductor chips 12 onto the printed circuit board 10. The process shown in FIG. 7 through FIG. 9 is a continuous process.

First, as shown in FIG. 7-(a), a printed circuit board suction head 42 is pressed onto the printed circuit board 10 placed on a printed circuit board placement table 40 so as to correct warpage of the printed circuit board 10. Then, the printed circuit board suction head 42 is operated to vacuum-suction the printed circuit board 10. The warpage correcting metal pattern 18 is formed on the back surface 10c of the printed circuit board 10, and a cream solder is applied on the warpage correcting metal pattern 18.

Then, as shown in FIG. 7-(b), the printed circuit board suction head 42 is moved so as to arrange the printed circuit board 10 on a board posture recognition camera 44. Then, two positioning holes 10b of the printed circuit board 10 are recognized by an image by the board posture recognition camera 44. Based on the recognition information, the printed circuit board suction head 42 is moved horizontally in XY directions and rotated in a θ direction so as to correct a position of the printed circuit board 10 relative to the positioning pins 16b of the conveyance carrier 16.

Subsequently, as shown in FIG. 7, the printed circuit board suction head 42 is moved above the conveyance carrier 16, and positioning is performed so that the positioning holes 10b of the printed circuit board 10 and the positioning pins 16b of the conveyance carrier 16 are aligned with each other. Then, the printed circuit board suction head 42 is moved downward and presses the printed circuit board 10 against the placement surface 16a of the conveyance carrier 16. At this time, the warpage correcting metal pattern 18 of the back surface 10c of the printed circuit board 10 and the cream solder 20 applied onto the warpage correcting metal pattern 18 are accommodated in the concave part 16c of the conveyance carrier 16.

Then, as shown in FIG. 7-(d), the solder heating part 30 is pressed against the conveyance carrier 16 so as to heat the conveyance carrier 16 from the backside to melt the cream solder 20 in the concave part 16c of the conveyance carrier 16 by the heat. At this time, the cartridge heater 32 of the solder heating part 30 is always in a power supply state and always generating heat.

Then, after the temperature detected by the thermocouple 36 of the solder heating part 30 reaches a predetermined temperature, it is judged that the cream solder 20 is melted, and the solder heating part 30 is caused to be separated from the conveyance carrier 16. The conveyance carrier 16 is cooled by surrounding air, and the melted solder 20 in the concave part 16c is also cooled and solidified. Thereby, the warpage correcting metal pattern 18 of the printed circuit board 10 is solder-joined to the conveyance carrier 16, and the printed circuit board 10 is held in a state where it is closely contact with the placement surface 16a of the conveyance carrier 16. Thus, the vacuum-suction of the printed circuit board suction head 42 is canceled, and the printed circuit board suction head 42 is moved upward.

According to the above-mentioned process shown in FIG. 7, the printed circuit board 10 is placed and fixed on the placement surface 16a of the conveyance carrier 16 in a state where the warpage is corrected. Subsequently, the process proceeds to a mounting process shown in FIG. 8 so as to mount the semiconductor chips 12 to the printed circuit board 10.

First, the conveyance carrier 16 on which the printed circuit board 10 is placed and fixed in a state where the warpage is corrected is moved to a parts mounting process part by a conveyance means such as a conveyor, a conveyance robot, etc. In the parts mounting process part, as shown in FIG. 8-(a), the semiconductor chips 12 are mounted on the printed circuit board 10 by a chip mounting head 46. After all of the semiconductor chips 12 are mounted, then, an under-fill material made of a thermosetting resin is supplied to each semiconductor chip 12 by an under-fill applicator 48. After the under-fill material is supplied to all of the semiconductor chips 12, then, as shown in FIG. 8-(c), a heating head 50 is pressed onto the back surface of each semiconductor chip 12 so as to heat the semiconductor chip 12 to cure the under-fill material.

According to the above-mentioned process shown in FIG. 8, the printed circuit board assembly, in which the semiconductor chips 12 are mounted on the printed circuit board 10 of which warpage is corrected, is completed. Consecutively, shifting to a process shown in FIG. 9, the printed circuit board assembly (printed circuit board 10) is removed from the conveyance carrier 16.

First, as shown in FIG. 9-(a), a printed circuit board removal and suction head 52 is pressed onto the printed circuit board assembly which is made of the printed circuit board 10 on which the semiconductor chips 12 are mounted. The printed circuit board removal and suction head 52 has a concave part corresponding to a part where each semiconductor chip 12 is mounted so that it can be pressed onto only the printed circuit bard 10 without contacting the semiconductor chips 12.

Next, as shown in FIG. 9-(b), the printed circuit board removal and suction head 52 is operated to vacuum-suction the printed circuit board assembly, and press the solder heating part 30 onto the conveyance carrier 16. The solder joining the warpage correcting metal pattern 18 to the conveyance carrier 16 is melted by heat from the cartridge heater 32.

Then, as shown in FIG. 9-(c), by moving the printed circuit board removal and suction head 52 upward, the printed circuit board assembly is removed from the conveyance carrier 16 and the solder heating part 30 is moved downward to be separated from the conveyance carrier 16.

Then, as shown in FIG. 9-(d), the printed circuit board assembly is moved to a position above the printed circuit board assembly placement table 54, and the printed circuit board removal and suction head 52 is moved upward after cancelling the vacuum-suction of the printed circuit board removal and suction head 52.

According to the above-mentioned process shown FIG. 8, the printed circuit board assembly is removed from the conveyance carrier 16, and is placed on the printed circuit board assembly placement table 54. Thereafter, the printed circuit board assembly is transferred to a process for individualize the semiconductor devices 14.

As mentioned above, according to the present embodiment, a space for correcting warpage required to the printed circuit board 10 is small, and what is required is to form the warpage correcting metal pattern 18 by copper plating on the back surface 10c of the printed circuit board 10 opposite to the mounting surface 10a, which does not increase a manufacturing cost of the printed circuit board 10.

Moreover, since there is no need to provide a member to be brought into contact with the mounting surface 10a of the printed circuit board 10 and generation of dusts can be avoided, the joining reliability can be acquired.

Furthermore, since warpage is corrected by the printed circuit board 10 being held flat also in the processes other than the parts mounting process, if there is needed a process for curing an under-fill material after mounting parts such as in flip-chip bonding, the printed circuit board 10 can be held flat until the under-fill material is cured. Accordingly, the under-fill can be cured in a state where a load is not applied to a joining part of a mounted part. Thus, a defect due to a stress in the joining part can be avoided, which improves a yield rate of the semiconductor devices 14. Additionally, in the point of view of manufacturing facilities, since there is no need to provide a warpage correcting means in the parts mounting process, an effect to reduce a facility cost can be expected.

Moreover, since the conveyance carrier 16 can be heated below the melting point of the solder used for joining printed circuit board 10 to the conveyance carrier 16, it can be easily coped with even for a mounting method that requires heating.

It should be noted that although the example, in which a plurality of semiconductor devices 14 are formed by mounting a plurality of semiconductor chips 12 on the printed circuit board 10 and the semiconductor devices 14 are individualize, has been explained in the above-mentioned embodiment, the warpage correcting method according to the present invention is applicable to a product other than the manufacture of the semiconductor devices 14.

Figure 10:
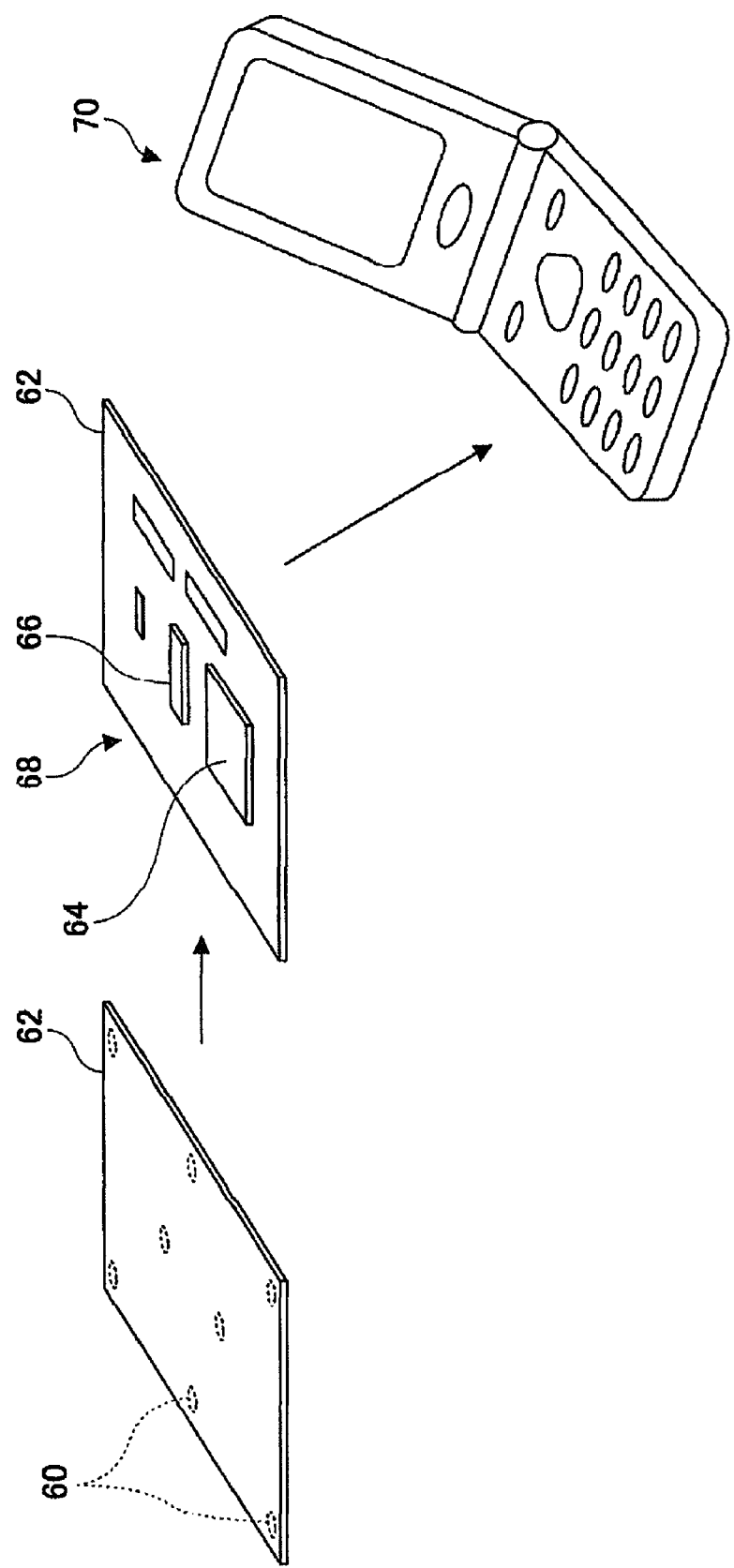
FIG. 10 is an illustration for explaining a structure to incorporate a printed circuit board assembly into an electronic device by forming the assembly using a warpage correcting method according to the present invention.

For example, as shown in FIG. 10, a printed circuit board assembly 68 is formed by mounting a semiconductor chip 64 and electronic part 66 to a printed circuit board 62, which has warpage correcting metal patterns 60 formed on a back surface thereof, while correcting warpage of the printed circuit board 62 as mentioned above. Then, the printed circuit board assembly 68 as a single part may be incorporated into an electronic device 70 such as, for example, a cellular phone or the like.

The present invention is not limited to the specifically disclosed embodiments, and variations and modifications may be made without departing from the scope of the present invention.

The present application is based on Japanese priority application No. 2006-322459 filed Nov. 29, 2006, the entire contents of which are hereby incorporated herein by reference.

What is claimed is:

1. A manufacturing method of a printed circuit board, comprising:

forming a warpage correcting metal pattern on a back surface of the printed circuit board;

placing the printed circuit board on a placement surface of a placement table in which a joining part is formed at a position opposite to said warpage correcting metal pattern protrudingly formed on the back surface of said printed circuit board while causing the back surface of the printed circuit board to closely contact with the placement surface of said placement table by accommodating the warpage correcting metal pattern in a concave part formed on the placement surface of said placement table; and correcting warpage of the printed circuit board by joining the warpage correcting metal pattern to the joining part using a thermally meltable joining material.

2. The manufacturing method of a printed circuit board as claimed in claim 1, wherein said thermally meltable joining material is supplied to at least one of said warpage correcting metal pattern and said concave part; and said warpage correction metal pattern is joined to said conveyance carrier by solidifying said thermally meltable joining material in said concave part after melting said thermally meltable joining material.

3. The manufacturing method of a printed circuit board as claimed in claim 2, wherein said thermally meltable joining material is heated by heating a part near said concave part of said conveyance carrier from outside.

4. The manufacturing method of a printed circuit board as claimed in claim 3, wherein heating of said part near said concave part of said conveyance carrier is performed by an electric heater being brought into contact with said part near said concave part of said conveyance carrier, and said thermally meltable joining material in said concave part is cooled and solidified by separating said electric heater from said conveyance carrier after heating.

5. The manufacturing method of a printed circuit board as claimed in claim 1, wherein said warpage correcting metal pattern is formed by copper plating, and said warpage correcting metal pattern is joined to said conveyance carrier using a solder as said thermally meltable joining material.

6. A manufacturing method of a printed circuit board assembly, comprising:

manufacturing a printed circuit board according to the manufacturing method of a printed circuit board according to claim 1; and mounting an electronic part to the printed circuit board that is joined to a conveyance carrier.

7. The manufacturing method of a printed circuit board assembly as claimed in claim 5, wherein said printed circuit board is separated from said conveyance carrier by heating and melting said thermally meltable joining material after mounting said electronic part to said printed circuit board.

8. The manufacturing method of a printed circuit board assembly as claimed in claim 6, wherein a thermosetting resin is supplied between said electronic part and said printed circuit board, and the thermosetting resin is heated to be cured by heating said electronic part.

9. The manufacturing method of a printed circuit board assembly as claimed in claim 8, said thermally meltable joining material is heated and melted after said thermosetting resin is cured, and said printed circuit board is separated from said conveyance carrier.

10. A correcting method of warpage of a printed circuit board, comprising:

correcting warpage of a printed circuit board by joining said printed circuit board to said conveyance carrier by a thermally meltable joining material while accommodating a warpage correcting metal pattern protrudingly formed on a back surface opposite to a mounting surface of the printed circuit board in a concave part of a flat placement surface of said conveyance carrier so that the back surface of said printed circuit board is closely contacted with the flat placement surface of said conveyance carrier.

11. The warpage correcting method of a printed circuit board as claimed in claim 10, wherein said thermally meltable joining material is supplied to at least one of said warpage correcting metal pattern and said concave part; and said warpage correction metal pattern is joined to said conveyance carrier by solidifying said thermally meltable joining material in said concave part after melting said thermally meltable joining material.

12. The warpage correcting method of a printed circuit board as claimed in claim 11, wherein said thermally meltable joining material is heated by heating a part near said concave part of said conveyance carrier from outside.

13. The correcting method of a printed circuit board as claimed in claim 12, wherein heating of said part near said concave part of said conveyance carrier is performed by an electric heater being brought into contact with said part near said concave part of said conveyance carrier, and said thermally meltable joining material in said concave part is cooled and solidified by separating said electric heater from said conveyance carrier after heating.

14. The correcting method of a printed circuit board as claimed in claim 10, wherein said warpage correcting metal pattern is formed by copper plating, and said warpage correcting metal pattern is joined to said conveyance carrier using a solder as said thermally meltable joining material.

* * * * *